United States Patent
Choi et al.

(10) Patent No.: US 9,519,091 B2
(45) Date of Patent: Dec. 13, 2016

(54) DISPLAY DEVICE INCLUDING A CONDUCTIVE PATTERN

(75) Inventors: Hyeon Choi, Daejeon (KR); Sujin Kim, Daejeon (KR); Ki-Hwan Kim, Daejeon (KR); Young Jun Hong, Daejeon (KR)

(73) Assignee: LG CHEM, LTD., Seoul (KR)

( * ) Notice: Subject to any disclaimer, the term of this patent is extended or adjusted under 35 U.S.C. 154(b) by 283 days.

(21) Appl. No.: 13/880,614

(22) PCT Filed: Oct. 21, 2011

(86) PCT No.: PCT/KR2011/007915
§ 371 (c)(1),
(2), (4) Date: Apr. 19, 2013

(87) PCT Pub. No.: WO2012/053872
PCT Pub. Date: Apr. 26, 2012

(65) Prior Publication Data
US 2013/0208198 A1    Aug. 15, 2013

(30) Foreign Application Priority Data

| Oct. 22, 2010 | (KR) | 10-2010-0103615 |
| Oct. 22, 2010 | (KR) | 10-2010-0103616 |
| Jan. 5, 2011 | (KR) | 10-2011-0000954 |
| Jan. 5, 2011 | (KR) | 10-2011-0000955 |
| Jan. 5, 2011 | (KR) | 10-2011-0000956 |
| Oct. 21, 2011 | (KR) | 10-2011-0108384 |

(51) Int. Cl.
| G02F 1/1333 | (2006.01) |
| G02B 5/30 | (2006.01) |
| H05K 1/02 | (2006.01) |
| G02F 1/1335 | (2006.01) |
| G02B 7/00 | (2006.01) |
| G02F 1/1343 | (2006.01) |
| H04N 13/04 | (2006.01) |

(52) U.S. Cl.
CPC ............ *G02B 5/3033* (2013.01); *G02B 7/008* (2013.01); *G02F 1/133382* (2013.01); *G02F 1/133602* (2013.01); *G02F 1/133615* (2013.01); *H05K 1/0212* (2013.01); *G02F 1/1343* (2013.01); *G02F 1/133553* (2013.01); *H04N 13/0402* (2013.01); *H04N 2213/001* (2013.01)

(58) Field of Classification Search
CPC ............ G02F 1/133382; G02F 1/1343; G02B 27/2214
See application file for complete search history.

(56) References Cited

U.S. PATENT DOCUMENTS

| 6,437,915 | B2 * | 8/2002 | Moseley et al. | 359/465 |
| 7,532,272 | B2 * | 5/2009 | Woodgate et al. | 349/95 |
| 2005/0219693 | A1 | 10/2005 | Hartkop | |
| 2008/0002079 | A1 * | 1/2008 | Kimura | G02B 6/0051 349/42 |
| 2008/0024694 | A1 * | 1/2008 | Kondo | G02B 6/0085 349/58 |
| 2011/0017726 | A1 * | 1/2011 | Choi et al. | 219/552 |

FOREIGN PATENT DOCUMENTS

| EP | 0446038 A2 | 9/1991 |
| EP | 2284134 A1 | 2/2011 |
| JP | 2007-186377 A | 7/2007 |
| JP | 2007186377 A | 7/2007 |
| KR | 20-0287050 Y1 | 8/2002 |
| KR | 200287050 B1 | 8/2002 |
| KR | 10-2003-0058721 A | 7/2003 |
| KR | 20030058721 A | 7/2003 |
| KR | 10-2007-0002127 | 1/2007 |
| KR | 10-2009-0113758 A | 11/2009 |
| KR | 20090113758 A | 11/2009 |
| WO | 2009-151203 A1 | 12/2009 |

* cited by examiner

*Primary Examiner* — Kendrick Hsu
(74) *Attorney, Agent, or Firm* — Dentons US LLP

(57) ABSTRACT

The present invention provides a display device comprising a display panel and a conductive pattern, in which the conductive pattern comprises an irregular pattern.

15 Claims, No Drawings

DISPLAY DEVICE INCLUDING A CONDUCTIVE PATTERN

This application is a 35 U.S.C. §371 National Stage Entry of International Application No. PCT/KR2011/007915, filed on Oct. 21, 2011, which claims priority from Korean Patent Application Nos. 10-2010-0103615, filed on Oct. 22, 2010; 10-2010-0103616, filed on Oct. 22, 2010; 10-2011-0000954, filed on Jan. 5, 2011; 10-2011-0000955, filed on Jan. 5, 2011; 10-2011-0000956, filed on Jan. 5, 2011; 10-2011-0108384, filed on Oct. 21, 2011, in the Korean Intellectual Property Office, all of which are incorporated herein by reference in their entirety.

TECHNICAL FIELD

The present invention relates to a display device comprising a conductive pattern. More particularly, the present invention relates to a display device which may exhibit uniform display characteristics over the entire display region.

BACKGROUND ART

Currently, devices based on liquid crystals in the flat panel display are widely used. A liquid crystal device is a system for implementing a display by controlling the polarization of penetrating light while the alignment of liquid crystal is changed by a voltage switch provided for each pixel.

In the case of 3D TVs based on liquid crystals which have recently emerged, 3D images are realized by binocular parallax. The most commonly used system in order to generate binocular parallax is to use a pair of glasses with shutters which are synchronized with the frequency response of a liquid crystal display. In the system, the liquid crystal display needs to show left eye and right eye images alternately, and when the liquid crystal switching speed is slow at this time, there may occur a phenomenon in which the left eye and right eye images are overlapped. Due to the overlapping phenomenon, viewers feel uncomfortable 3D effects, and thus vertigo and the like may occur.

The movement of liquid crystals used in a liquid crystal display is subject to the change in speed according to the ambient temperature. That is, when a liquid crystal display is driven at a low temperature, the liquid crystal switching speed becomes slow, and when the liquid crystal display is driven at a high temperature, the liquid crystal switching speed becomes fast. In the case of a current 3D TV using a liquid crystal display, heat generated from a backlight unit may affect the liquid crystal speed. In particular, when a backlight unit of a product known as an LED TV is positioned only at the edge of the display, heat generated from the backlight unit may increase only the temperature therearound causing a deviation in the liquid crystal driving speed, thereby further increasing the non-ideal implementation of 3D images.

DETAILED DESCRIPTION OF THE INVENTION

Technical Problem

An object of the present invention is to provide a display device having uniform and excellent display characteristics and a reduced Moire phenomenon in spite of a deviation in temperature according to the change in external temperature or the position of a light source.

Technical Solution

The present invention provides a display device comprising a display panel, a bus bar, and a conductive pattern, in which the conductive pattern comprises an irregular pattern.

The present invention provides a display device in which the conductive pattern comprises a conductive heating pattern which is electrically connected to the bus bar.

The present invention provides a display device in which the conductive pattern comprises a conductive heating pattern which is electrically connected to the bus bar and a conductive non-heating pattern which is not electrically connected to the bus bar.

In the present invention, the irregular pattern may comprise a pattern in which, when a straight line that intersects the conductive pattern is drawn, a ratio of standard deviation with respect to an average value of distances between adjacent intersection points of the straight line and the conductive pattern (distance distribution ratio) is 2% or more.

In the present invention, the irregular pattern may comprise a pattern that is formed of closed figures in which a distribution is continuous and a ratio of standard deviation with respect to an average value of areas of the closed figures (area distribution ratio) is 2% or more.

In the present invention, the irregular pattern may comprise a conductive pattern of a boundary form of figures forming a Voronoi diagram.

In the present invention, the irregular pattern may comprise a conductive pattern of a boundary form of figures formed of at least one triangle forming a Delaunay pattern.

The present invention provides a polarizing plate comprising a polarizing film and a polarizing film protective film provided on at least one side of the polarizing film, in which at least one of the polarizing film protective film comprises a transparent substrate and a conductive pattern provided on at least one side of the transparent substrate, and the conductive pattern comprises an irregular pattern.

Advantageous Effects

The display device according to the present invention may provide uniformly display characteristics of a display panel in spite of a deviation in temperature according to the change in external temperature or the position of a light source by providing a conductive pattern, and minimize the Moire phenomenon by allowing the conductive pattern to comprise an irregular pattern.

The display device according to the present invention may uniformly provide display characteristics of a display panel by providing a conductive heating pattern, and minimize the Moire phenomenon by allowing the conductive heating pattern to comprise an irregular pattern.

The display device according to the present invention may comprise a conductive heating pattern and a conductive non-heating pattern, which allows the entire conductive pattern to be uniformly distributed, thereby preventing a visual field from being interrupted by a conductive pattern.

BEST MODE

The display device according to the present invention comprises a display panel and a conductive pattern, in which the conductive pattern comprises an irregular pattern. The conductive pattern may be formed in a region having 10% or more of an area of a display screen unit of the display device. The display device according to the present invention may further comprise a bus bar.

The display device according to the present invention may show excellent display characteristics using a conductive pattern even during the initial drive at a low temperature, and may provide uniform display characteristics on the entire display screen even when there occurs a deviation in temperature on the entire display screen according to the position of a light source as in the case when a light source such as an edge-type light source or the like is positioned on the side surface thereof.

The present invention may show the above-described excellent display characteristics by comprising a conductive pattern, and reduce the Moire phenomenon, which may be generated by a regular form of a pixel of the display device and a regular form of a pattern thereof by allowing the conductive pattern to comprise an irregular pattern. In general the Moire phenomenon is a phenomenon generated when two regular patterns are overlapped. In a display device, the Moire phenomenon occurs when a regular form of the pixel and a regular form of the conductive pattern are overlapped with each other. However, the present invention may reduce the additional occurrence of the Moire phenomenon, and the Moire which may be generated from other parts by allowing the conductive pattern to comprise the irregular pattern in order to improve display characteristics according to the temperature.

Further, in the present invention, the Moire phenomenon may be prevented by assembling a part with a regular pattern provided with the rest of the parts of the display device without considering the arrangement angle of the conductive pattern comprising an irregular pattern even without making an effort, such as disposing the part so as to make a predetermined angle in the relationship with the form of the pixel and the like in order to prevent the Moire phenomenon in the related art.

According to an exemplary embodiment of the present invention, the conductive pattern may comprise a conductive heating pattern which is electrically connected to the bus bar.

According to another exemplary embodiment of the present invention, the conductive pattern may comprise a conductive heating pattern which is electrically connected to the bus bar and a conductive non-heating pattern which is not electrically connected to the bus bar.

The display device according to the present invention may show excellent display characteristics even during the initial driving at a low temperature by comprising a conductive heating pattern which is electrically connected to a bus bar, and may prevent a visual field from being interrupted by using a conductive non-heating pattern which is not electrically connected to the bus bar to make the distribution of the conductive pattern uniform. In particular, when heating is required on a part of the display screen in the display device, the visual field may be interrupted because the presence of the pattern is visible when a conductive heating pattern is formed only on a part thereof. However, the conductive pattern may be uniformly distributed by using the conductive non-heating pattern in the present invention, thereby preventing the visual field from being interrupted.

In the present specification, the fact that a pattern is electrically connected to the bus bar means that current flows when the patterns are connected to two independent bus bars which are mutually opposite from each other, respectively and a voltage is applied thereto. In the present specification, a pattern which is electrically connected to the bus bar refers to a conductive heating pattern for convenience. On the contrary, the fact that a pattern is not electrically connected to the bus bar means that current may not flow when a voltage is applied thereto. In the present specification, a pattern which is not electrically connected to the bus bar refers to a conductive non-heating pattern for convenience. The entire pattern comprising the conductive heating pattern and the conductive non-heating pattern refers to a conductive pattern.

According to an exemplary embodiment of the present invention, the irregular pattern may comprise a pattern in which, when a straight line that intersects the conductive pattern is drawn, a ratio of standard deviation with respect to an average value of distances between adjacent intersection points of the straight line and the conductive pattern (distance distribution ratio) is 2% or more.

The straight line that intersects the conductive pattern may be a line having the smallest standard deviation of distances between adjacent intersection points of the straight line and the conductive pattern. Alternatively, the straight line that intersects the conductive pattern may be a straight line which is extended in a direction vertical to the tangential line of any one point of the conductive pattern. It is possible to prevent side effects caused by the diffraction and interference of a light source and the Moire by using the conductive pattern in this manner.

The straight line that intersects the conductive pattern may have 80 or more intersection points with the conductive pattern.

The ratio of standard deviation with respect to an average value of distances between adjacent intersection points of the straight line that intersects the conductive pattern and the conductive pattern (distance distribution ratio) may be 2% or more, 10% or more, and 20% or more.

A conductive pattern having a different form may also be provided on at least a part of the surface of a substrate with a conductive pattern provided, in which the ratio of standard deviation with respect to an average value of distances between adjacent intersection points of the straight line and the conductive pattern (distance distribution ratio) is 2% or more.

According to another exemplary embodiment of the present invention, the irregular pattern may comprise a pattern that is formed of closed figures in which a distribution is continuous and a ratio of standard deviation with respect to an average value of areas of the closed figures (area distribution ratio) is 2% or more. It is possible to prevent side effects caused by the diffraction and interference of a light source and Moire by using the conductive pattern in this manner.

At least 100 of the closed figures may be present.

The ratio of standard deviation with respect to an average value of areas of the closed figures (area distribution ratio) may be 2% or more, 10% or more, and 20% or more.

A conductive pattern having a different form may also be provided on at least a part of the surface of a substrate with a conductive pattern provided, in which the ratio of standard deviation with respect to an average value of areas of the closed figures (area distribution ratio) is 2% or more.

When the conductive patterns are completely irregular, a difference may occur between a sparse place and a dense place in the distribution of lines. The distribution of the lines may cause a problem in that the line is visible, however thin the line width is. In order to solve the problem of visual perceptibility, the present invention may appropriately harmonize regularity and irregularity when a conductive pattern is formed. For example, a basic unit may be determined such that the conductive pattern may not be visible or a local heating may not occur, and a conductive pattern may be formed in an irregular pattern within the basic unit. When the method is used, visibility may be complemented by allowing the distribution of lines not to be concentrated at any one point.

The conductive pattern may be a straight line, but may be various modifications such as a curved line, a wave line, a zigzag line, and the like.

According to yet another exemplary embodiment of the present invention, the irregular pattern may comprise a conductive pattern of a boundary form of figures forming a Voronoi diagram.

It is possible to prevent the Moire and minimize side effects caused by the diffraction and interference of light by forming the conductive pattern in a boundary form of figures forming a Voronoi diagram. The Voronoi diagram is a pattern formed by using a method in which when points called the Voronoi diagram generator are disposed in a region to be filled, a region, in which each point is closest in distance to the corresponding point compared to the distance between the point and the other points, is filled. For example, when nationwide big discount store are represented by points and customers are supposed to visit a big discount store, which is the closest to each customer, a pattern that represents the trading area of each discount store may be taken as an example. That is, when space is filled with a regular hexagon and points of the regular hexagons are selected by a Voronoi generator, a honeycomb structure may become the conductive pattern. When a conductive pattern is formed by using a Voronoi diagram generator, the present invention is advantageous in that it is possible to easily determine a complicated pattern form that may minimize side effects caused by the diffraction and interference of light.

In the present invention, a pattern derived from the generator may be used by regularly or irregularly disposing the position of the Voronoi diagram generator.

Even when the conductive pattern is formed in a boundary form of figures forming the Voronoi diagram, regularity and irregularity may be appropriately harmonized when a Voronoi diagram generator is produced in order to solve the above-described problem of visual perceptibility. For example, after an area having a predetermined size is designated as a basic unit in an area in which the pattern will be formed, points may be produced such that the distribution of points in the basic unit has irregularity, and then the Voronoi pattern may also be manufactured. When the method is used, visibility may be complemented by allowing the distribution of lines not to be concentrated at any one point.

As described above, it is possible to control the number of Voronoi diagram generators per unit area in order to consider the visibility of the conductive pattern or fit the thermal density required for a display device. At this time, when the number of Voronoi diagram generators per unit area is controlled, the unit area may be 5 cm$^2$ or less, and 1 cm$^2$ or less. The number of Voronoi diagram generators per unit area may be selected within a range from 25 to 2,500 ea/cm$^2$, and from 100 to 2,000 ea/cm$^2$.

At least one of the figures forming the pattern in a unit area may have a form different from the other figures.

According to still another exemplary embodiment of the present invention, the irregular pattern may comprise a conductive pattern of a boundary form of figures formed of at least one triangle forming a Delaunay pattern.

Specifically, the form of the conductive pattern may be a boundary form of triangles forming a Delaunay pattern, a boundary form of figures formed of at least two triangles forming a Delaunay pattern, or a combined form thereof.

It is possible to minimize the Moire phenomenon and side effects caused by the diffraction and interference of light by forming the conductive pattern in a boundary form of figures formed of at least one triangle forming a Delaunay pattern. The Delaunay pattern is a pattern formed by disposing points called the Delaunay pattern generator in a region in which the pattern will be filled and drawing a triangle by connecting three points therearound such that when a circumcircle comprising all corners of the triangle is drawn, there is no other point in the circumcircle. In order to form the pattern, Delaunay triangulation and circulation may be repeated based on the Delaunay pattern generator. The Delaunay triangulation may be performed in such a way that a thin triangle is avoided by maximizing the minimum angle of all the angles of the triangle. The concept of the Delaunay pattern was proposed by Boris Delaunay in 1934.

The pattern of the boundary form of figures formed of at least one triangle forming the Delaunay pattern may use a pattern derived from the generator by regularly or irregularly positioning the Delaunay pattern generator. In the present invention, when the conductive heating pattern is formed by using the Delaunay pattern generator, there is an advantage in that a complicated pattern form may be easily determined.

Even when the conductive pattern is formed in a boundary form of figures formed of at least one triangle forming the Delaunay pattern, regularity and irregularity may be appropriately harmonized when a Voronoi diagram generator is produced in order to solve the above-described problem of visual perceptibility.

It is possible to control the number of Delaunay pattern generators per unit area in order to consider the visibility of the conductive pattern or fit the thermal density required for a display device. At this time, when the number of Delaunay pattern generators per unit area is controlled, the unit area may be 5 cm$^2$ or less, and 1 cm$^2$ or less. The number of Delaunay pattern generators per unit area may be selected within a range from 25 to 2,500 ea/cm$^2$, and from 100 to 2,000 ea/cm$^2$.

At least one of figures forming the pattern in unit area may have a form different from the other figures.

Since the above-described conductive pattern is formed on a substrate by using the method described below, the line width and line height may be made uniform. According to an exemplary embodiment of the present invention, at least a part of the conductive pattern may be formed differently from the other patterns by artificial means. A desired conductive pattern may be obtained by this configuration. The line widths and line intervals of the printing pattern may be set to be different from each other such that at least a part of the conductive pattern is different from the other printing patterns. Whereby, the heat may be generated more rapidly or efficiently at a desired place.

In order to prevent the Moire and maximize the minimization of side effects caused by the diffraction and interference of light, the conductive pattern may be formed such that the area of the pattern that is formed of the figures having an asymmetric structure is larger than the entire pattern area by 10% or more. Furthermore, the conductive pattern may be formed such that the area of the figures, in which at least one of the lines that connects the central point of any one figure that forms the Voronoi diagram with the central point of the adjacent figure forming the boundary with the figure is different from the other lines in terms of length, is larger than the entire conductive pattern area by 10% or more. Further, the conductive pattern may be formed such that the area of the pattern formed of the figures in which the length of at least one side that forms the figure that is formed of at least one triangle forming the Delaunay pattern is different from the length of the other sides is 10% or more with respect to the area in which the entire conductive pattern is formed.

When the conductive pattern is manufactured, the pattern is designed in a limited area, and then a large area pattern may be manufactured by using the method in which the limited area is repeatedly connected. In order to repeatedly connect the patterns, the repetitive patterns may be connected to each other by fixing the positions of the points of each quadrilateral. At this time, the limited area may be an area of 1 $cm^2$ or more, and 10 $cm^2$ or more in order to minimize the Moire phenomenon and the diffraction and interference of light by the repetition.

In the present invention, the temperature around the liquid crystal may be increased by imparting the heating function to the liquid crystal display, and through this, the 3D image distortion generated from a 3D display device may be minimized by implementing a high liquid crystal switching speed.

The 3D display device may comprise a pattern retarder which is disposed on the front surface of the display panel. The pattern retarder serves as a role of splitting light from the display panel into a first polarized light and a second polarized light. In addition, the 3D display device may comprise a parallax barrier or a lenticular plate.

The display device according to the present invention may additionally comprise a light source, and the light source may be either a direct type or an edge type. When the light source is an edge type, a light guide plate may be comprised between the light source and the display panel. The edge-type light source may be disposed at one or more edge portions of a light guide plate. For example, the light source may be disposed only at one side of the light guide plate, or at two to four edge portions thereof.

In the present invention, when the display device comprises an edge-type backlight unit, it is possible to comprise a conductive pattern which may compensate for the deviation in temperature by a light source of the edge-type backlight unit. The conductive pattern may be disposed inversely proportional to the temperature according to the disposition of the light source of the edge-type backlight unit. Specifically, the conductive non-heating pattern may be formed such that the density is higher in a region closer to the light source of the edge-type backlight unit than the density in a region farther from the light source of the edge-type backlight unit, and the conductive heating pattern may be formed such that the density is higher in a region farther from the light source of the edge-type backlight unit than the density in a region closer to the light source of the edge-type backlight unit.

The display device according to the present invention may additionally comprise a power source unit that is connected to a bus bar. The bus bar and the power source unit may be formed by using a method known in the art. For example, the bus bar may be formed simultaneously with the formation of the conductive pattern, and may also be formed by using the same or different printing method after the conductive pattern is formed. For example, after the conductive pattern may be formed by an offset printing method, a bus bar may be formed through screen printing. At this time, the thickness of the bus bar may be 1 to 100 micrometers, and 10 to 50 micrometers. When the thickness is less than 1 micrometer, the contact resistance between the conductive pattern and the bus bar may be increased and thus the contacted portion may be locally heated, and when the thickness exceeds 100 micrometers, the electrode material costs are increased. The connection between the bas bar and the power source may be achieved through soldering, or physical contact with a structure having good conductive heating.

In order to conceal the conductive pattern and the bus bar, a black pattern may be formed. The black pattern may be printed by using a paste that comprises cobalt oxides. At this time, it is appropriate that the printing method is screen printing and the thickness thereof may be 10 to 100 micrometers. The conductive pattern and the bus bar may be formed before or after the black pattern is formed, respectively.

In the present invention, the display panel may comprise a liquid crystal cell. The liquid crystal cell may comprise two substrates, and a liquid crystal material sealed between the substrates.

In the present invention, the display panel may further comprise two polarizing plates each provided at both sides of the liquid crystal cell. The polarizing plate may comprise a polarizing film and a protective film provided on at least one side of the polarizing film.

In the present invention, the display panel may additionally comprise a phase difference compensation film. The phase difference compensation film may be additionally comprised between the liquid crystal cell and a polarizing plate on at least one side thereof, and between a polarizing plate and a light source.

The display device according to the present invention may further comprise other parts known in the art. For example, the display device may further comprise a color filter, an antireflection layer, a UV-blocking layer, an electromagnetic shielding layer, a hardcoat layer, and the like.

The conductive pattern may be present in an independent form of a heating element comprising a transparent substrate and a conductive pattern provided on the transparent substrate and thus may also be assembled in the display device, but the conductive pattern may also be directly formed in at least one constituent element of the display device.

For example, the heating element may also be disposed on the front surface or rear surface of an edge-type backlight unit of the display device, and may also be disposed between the liquid crystal cell and the polarizing plate. Furthermore, the heating element may also be provided on the front surface or rear surface of the display panel, may also be provided between the liquid crystal cell and at least one polarizing plate, and may also be provided between the display panel and the light source and on the front surface or rear surface of the light guide plate.

The conductive pattern may also be formed directly at the light guide plate of an edge-type backlight unit of the display device, and may also be formed directly on the inner side or outer side of the upper substrate or lower substrate of the liquid crystal cell. Further, the conductive pattern may also be formed directly on at least one protective film or phase difference film of the polarizing plate.

The transparent substrate is not particularly limited, but the light transmittance thereof may be 50% or more, and 75% or more. Specifically, as the transparent substrate, glass may also be used, and a plastic substrate or plastic film may be used. When a plastic film is used, a conductive heating pattern and a conductive non-heating pattern are formed, and then a glass substrate or plastic substrate may be attached together to at least one surface of the substrate. At this time, a glass substrate or plastic substrate may be attached together to a surface of a transparent substrate on which a conductive heating pattern and a conductive non-heating pattern are formed. As the plastic substrate or film, a material known in the art may be used, and examples thereof comprise a film having a visible light transmittance of 80% or more, such as polyethylene terephthalate (PET), polyvinylbutyral (PVB), polyethylene naphthalate (PEN), polyethersulfone (PES), polycarbonate (PC), and acetyl celluloid. The thickness of the plastic film may be 12.5 to 500 micrometers, and 30 to 150 micrometers.

When the transparent substrate has optical characteristics so as to serve as any one constituent element of the display device, a material for the transparent substrate may be selected from materials having optical characteristics, which are known in the art. For example, when the transparent substrate serves as a phase difference compensation film, the phase difference value of the transparent substrate may be determined according to the kind of display panel, and specifically when the display panel is a liquid crystal cell, according to a liquid crystal mode to be sealed in the liquid crystal cell. In addition, when the transparent substrate serves as a light guide plate, a material for the transparent substrate may be selected from materials for a light guide plate, which are known in the art.

Hereinafter, the present invention will be specifically illustrated through specific embodiments thereof, but is not limited thereto.

Hereinafter, it will be described that the heating element comprises a transparent substrate and a conductive pattern provided thereon, but the transparent substrate may also be a separate transparent substrate, and may also be one constituent element of a display device as described above.

In the first exemplary embodiment of the present invention, the display device comprises two substrates and a liquid crystal cell comprising a liquid crystal material sealed between the substrates, and at least one of the substrates comprises a conductive pattern provided on at least one side thereof. The conductive pattern may also be provided on the outer side of the substrate, or on the inner side thereof, that is, on a side surface in which the liquid crystal material is sealed.

In the first exemplary embodiment of the present invention, an additional transparent substrate provided on a surface on which the conductive pattern of the substrate is provided may be comprised. When the additional transparent substrate is attached together thereto, a bonding film may be inserted between the conductive pattern and the additional transparent substrate. Temperature and pressure may be controlled during bonding.

In the first exemplary embodiment of the present invention, as a substrate constituting the liquid crystal cell, those known in the art may be used. The substrate is not particularly limited, but the light transmittance thereof may be 50% or more, and 75% or more. Specifically, as the substrate, glass may also be used, and a plastic substrate may be used. At this time, a glass or plastic substrate may also be attached to a surface on which the conductive pattern of the substrate is formed. As the plastic substrate, a material known in the art may be used, and examples thereof comprise a material having a visible light transmittance of 80% or more, such as polyethylene terephthalate (PET), polyvinylbutyral (PVB), polyethylene naphthalate (PEN), polyethersulfone (PES), polycarbonate (PC), and acetyl celluloid.

In the first exemplary embodiment of the present invention, the conductive pattern may also be provided on 30% or more of the entire area of at least one of the substrates constituting the liquid crystal cell, 70% or more thereof, and 90% or more thereof.

In a second exemplary embodiment of the present invention, the display device comprises a polarizing film and a polarizing film protective film provided on at least one surface of the polarizing film, and the conductive pattern may be provided on at least one side or both sides of the polarizing film protective film.

In the second exemplary embodiment of the present invention, the display device comprises a polarizing plate, the polarizing plate comprises a polarizing film and a polarizing film protective film provided on at least one surface of the polarizing film, and the polarizing film protective film comprises a transparent substrate and a conductive pattern provided on at least one surface of the transparent substrate.

In the second exemplary embodiment of the present invention, the transparent substrate is not particularly limited, but is not particularly limited as long as the transparent substrate may be used as a polarizing film protective film. For example, the transparent substrate may be isotropic. Specific examples thereof comprise films composed of a polyester-based polymer such as polyethylene terephthalate and polyethylene naphthalate, a cellulose-based polymer such as diacetyl cellulose and triacetyl cellulose, an acrylic polymer such as polymethyl (meth)acrylate, a styrene-based polymer such as polystyrene and an acrylonitrile-styrene copolymer (AS resin), a polycarbonate-based polymer, or the like. Also, it is also possible to use films composed of a polyolefin-based polymer, a vinyl chloride-based polymer, an amide-based polymer such as nylon and aromatic polyamide, a vinyl alcohol-based polymer, a vinylidene chloride-based polymer, a vinyl butyral-based polymer, an arylate-based polymer, a polyoxymethylene-based polymer, an epoxy-based polymer, a blend of the aforementioned polymers, or the like. Furthermore, it is possible to use a film comprising a thermosetting or ultraviolet-ray curing resin such as an acryl series, a urethane series, an acrylurethane series, s and a silicone series. In the present invention, as the transparent substrate, a triacetyl cellulose film or an acrylic polymer film may be used.

In a third exemplary embodiment of the present invention, the display device comprises a heating element, and the heating element comprises a transparent substrate and a conductive pattern provided on at least one surface of the transparent substrate.

In the third exemplary embodiment of the present invention, the conductive pattern may be provided on 30% or more of the entire area of the transparent substrate, 70% or more thereof, and 90% or more thereof.

In the third exemplary embodiment of the present invention, the transparent substrate may be one having optical characteristics, which may serve as one constituent element of a display device, or one that does not affect optical characteristics of the display device. The transparent substrate is not particularly limited, but the light transmittance thereof may be 50% or more, and 75% or more. Specifically, as the transparent substrate, glass may also be used, and a plastic substrate or plastic film may be used. At this time, a glass or plastic substrate may also be attached together to a surface on which the conductive pattern of the transparent substrate is formed. As the plastic substrate or film, a material known in the art may be used, and examples thereof comprise a film having a visible light transmittance of 80% or more, such as polyethylene terephthalate (PET), polyvinylbutyral (PVB), polyethylene naphthalate (PEN), polyethersulfone (PES), polycarbonate (PC), and acetyl celluloid. The thickness of the plastic film may be 12.5 to 500 micrometers, and 50 to 250 micrometers.

In the third exemplary embodiment of the present invention, the transparent substrate of the heating element is one having optical characteristics, and may perform an additional optical function in addition to the function of the heating element. For example, the transparent substrate has optical characteristics of a phase difference protective film, and thus the heat generating film may also serve as the phase difference protective film. Further, the transparent substrate has optical characteristics of a light guide plate, and thus the heat generating film may also serve as the light guide plate. When the transparent substrate has optical characteristics so as to serve as any one constituent element of the display device, a material for the transparent substrate may be selected from materials having optical characteristics, which are known in the art. For example, when the transparent substrate serves as a phase difference compensation film, the phase difference value of the transparent substrate may be determined according to the kind of display panel, and specifically when the display panel is a liquid crystal cell, according to a liquid crystal mode to be sealed in the liquid crystal cell. In addition, when the transparent substrate serves as a light guide plate, a material for the transparent substrate may be selected from materials for a light guide plate, which are known in the art.

In the present invention, the conductive heating pattern and the conductive non-heating pattern may be disposed such that heat generation is uniformly performed over the entire display screen unit of the display device, and may also be disposed such that heat generation is performed only in a specific region so as to allow the entire display screen unit of the display device to have a uniform temperature according to the purpose thereof. For example, when the display device has an edge-type light source, it is possible to prevent a visual field from being interrupted by the conductive pattern while providing a local heat generation by disposing a conductive heating pattern at a place in which a light source is not positioned, and providing uniform display characteristics over the entire display screen by disposing a conductive non-heating pattern at a place in which the light source is positioned, in order to prevent a deviation in temperature from being generated by the light source. In other words, the conductive non-heating pattern may be formed such that the density is higher in a region closer to the light source of the edge-type backlight unit than the density in a region farther from the light source of the edge-type backlight unit, and the conductive heating pattern may be formed such that the density is higher in a region farther from the light source of the edge-type backlight unit than the density in a region closer to the light source of the edge-type backlight unit.

In the display device according to the present invention, even when a deviation in temperature according to a light source occurs, the standard deviation of the surface temperature in the entire display screen unit of the display device may be 20% or less, 15% or less, and 10% or less by the above-described heating element.

For uniform surface temperature, the conductive heating pattern may be formed by controlling the thickness, interval, height, form and the like of the conductive heating pattern according to the position or interval of the bus bar and the geometric shape of the heat generation area.

In the present invention, the conductive non-heating pattern may be disposed such that the distribution of the entire pattern comprising the conductive heating pattern and the conductive non-heating pattern is made uniform. Whereby, a visual field may be prevented from being interrupted by making the distribution of the entire pattern uniform even though the distribution of the conductive heating pattern that substantially generates heat is not uniform. For example, the entire conductive pattern comprising the conductive heating pattern and the conductive non-heating pattern according to the present invention may have a pattern density having a deviation in an opening ratio of 5% or less with respect to any circumcircle having a diameter of 20 cm Here, the opening ratio means a ratio of an area which is not covered with the pattern to a region provided with the pattern.

In the present invention, the conductive heating pattern and the conductive non-heating pattern may be designed by designing a cliche when a printing method is used, and may be designed by designing a photomask when a photolithography method is used. Furthermore, the conductive non-heating pattern may also be formed by cutting off a part of the conductive heating pattern.

In the present invention, the Moire phenomenon of the display device may be reduced by forming the entire conductive pattern comprising the conductive heating pattern and the conductive non-heating pattern in an irregular pattern.

The entire conductive pattern may occupy 30% or more of the entire area of the transparent substrate, 70% or more thereof, and 90% or more thereof.

Since the above-described conductive pattern is formed on a transparent substrate by using the method described below, the line width and line height may be made uniform. According to an exemplary embodiment of the present invention, at least a part of the conductive patterns may be formed differently from the other patterns by artificial means. A desired conductive pattern may be obtained by this configuration. The line widths and line intervals of the printing patterns may be set to be different such that at least a part of the patterns is different from the other printing patterns. Whereby, the heat may be generated more rapidly or efficiently at a desired place.

When the conductive pattern is manufactured, the pattern is designed in a limited area, and then a large area pattern may be manufactured by using the method in which the limited area is repeatedly connected. In order to repeatedly connect the patterns, the repetitive patterns may be connected to each other by fixing the positions of the points of each quadrilateral. At this time, the limited area may be an area of 1 cm$^2$ or more, and 10 cm$^2$ or more in order to minimize the Moire phenomenon and the diffraction and interference of light by the repetition. In the present invention, a conductive pattern is designed, and then may be formed by the following method. The conductive heating pattern or conductive non-heating pattern may be firstly formed by using a method in which the pattern is directly printed on the transparent substrate, and then drying or sintering is performed, may also be secondly formed by a method using an etching resist pattern, and may also be thirdly formed by using a photograph method to form a silver pattern on a transparent substrate coated with a silver salt, and then using a method in which the thickness of the hot wire is increased until a desired sheet resistance is obtained through plating. The pattern formation method described below may apply to both the conductive heating pattern and the conductive non-heating pattern.

When a printing method which is the first method among the above methods is used, a paste comprising a thermal conductive material may be printed on a transparent substrate by the printing method. When the printing method is used, a relatively low cost is required and a preparation process is also simple, and a precise pattern having a thin line width may be formed.

In the present invention, a precise conductive pattern having a thin line width may be formed on a substrate by first determining a target pattern form, and then using a printing method, a photolithography method, a photography method, a method using a mask, a sputtering method, an inkjet method or the like.

The printing method may be performed in a manner in which a paste comprising a conductive pattern material is transferred in a target pattern form on a substrate, and then sintered. The transferring method is not particularly limited, but a desired pattern may be transferred on a substrate by forming the pattern form on a pattern transfer medium such as an intaglio, a screen or the like, and using the pattern form. The method of forming a pattern form on the pattern transfer medium may use a method known in the art.

The printing method is not particularly limited, and a printing method such as an offset printing, a screen printing, a gravure printing and the like may be used. The offset printing may be performed by using a method in which an intaglio on which a pattern is engraved is filled with a paste, is subjected to a primary transfer with a silicone rubber called a blanket, and then is subjected to a secondary transfer by closely contacting the blanket with the substrate, but is not limited thereto. The screen printing may be performed by using a method in which after a paste is positioned on a screen with a pattern, the paste is positioned directly on the substrate through a screen in which space is empty while a squeegee is pushed. The gravure printing may be performed by using a method in which after a pattern is filled with a paste while the blanket where the pattern is engraved on a roll is wound, transfer is performed on a substrate. In the present invention, the above method may be used and the above methods may be used in combination. Further, the other printing methods known to those skilled in the art may also be used.

In the case of the offset printing method, since nearly most of the paste is transferred on a substrate such as glass due to the release property of the blanket, a separate blanket washing process is not required. The intaglio may be manufactured by precisely etching the glass on which a target conductive pattern is engraved, and metal or DLC (diamond-like carbon) coating may also be performed on the glass surface for durability thereof. The intaglio may be manufactured by etching the metal plate.

In the present invention, in order to implement a more precise conductive pattern, the offset printing method may be used. The offset printing method is performed by filling the pattern of the intaglio with the paste by using a doctor blade and performing a first transfer by rotating the blanket as a first step, and performing a second transfer on the surface of the substrate by rotating the blanket as a second step.

In the present invention, the photolithography process may also be used without being limited to the above-described printing method. For example, the photolithography process may be performed by using a method in which a conductive pattern material layer is formed on the front surface of the substrate, a photoresist layer is formed thereon, the photoresist layer is patterned by the selective exposure and the development process, then the conductive pattern is patterned by etching the conductive pattern material layer using the patterned photoresist layer as a mask, and the photoresist layer is removed.

The conductive pattern material layer may also be formed by subjecting a metal thin film such as copper, aluminum and silver to lamination using an adhesion layer on the substrate. In addition, the conductive pattern material layer may also be a metal layer formed on the substrate by using sputtering or a physical vapor deposition method. At this time, the conductive pattern material layer may also be formed as a multilayered structure of a metal having good electrical conductivity, such as copper, aluminum and silver, and a metal having good adhesion with the substrate and a dark color, such as Mo, Ni, Cr and Ti. At this time, the thickness of the metal thin film may be 20 micrometers or less, and 10 micrometers or less.

When the etching resist pattern is formed by a photolithography process, the process may be performed by using a method in which an etching resist layer is formed on the front surface of the metal thin film, the etching resist layer is patterned by the selective exposure and the development process, then a pattern is formed by etching the metal thin film using the patterned etching resist layer as a mask, and the etching resist pattern is removed.

When the etching resist pattern is formed by the printing process, a reverse offset printing method or a gravure offset method may be used. The etching resist pattern may use a material of a Novolac series, an acryl series and a silicone series, but is not limited thereto.

In order to minimize the diffraction/interference caused by a single light source, an irregular pattern is advantageous as the etching resist pattern, but the etching resist pattern may have a pattern density having a deviation in transmittance of 5% or less with respect to any circumcircle having a diameter of 20 cm. Furthermore, in the case of a regular pattern such as the wave pattern, the interval between lines constituting the pattern may be 2 mm or more.

A metal thin film may be etched by immersing a transparent substrate with the metal thin film provided with the etching resist pattern in an etchant. The etchant may use an acidic solution. The acidic solution may use a strong acid such as hydrochloric acid, nitric acid, sulfuric acid and phosphoric acid, and an organic acid such as formic acid, butyric acid, lactic acid, sorbic acid, fumaric acid, malic acid, tartaric acid and citric acid, and hydrogen peroxide water and other additives may be further added to the solution.

In the present invention, a photoresist layer may also be formed by using the printing process instead of the photolithography process in the above photolithography process.

The present invention may also use a photography method. For example, after a photographic photosensitive material comprising silver halide is applied on a substrate, a pattern may also be formed by subjecting the photosensitive material to selective exposure and a development process. A more detailed example will be described below. First, a negative photosensitive material is applied on a substrate on which a pattern will be formed. At this time, a polymer substrate such as PET, acetyl celluloid and the like may be used as the substrate. The negative photosensitive material may be composed of silver halide in which a small amount of AgI is mixed with AgBr which is generally very sensitive to light and regularly reacted with light. Since an image which is developed by picturing a general negative photosensitive material is a negative picture that is opposite to a subject in terms of light and shade, the mask used in the photography may be a mask having a pattern shape to be formed and a mask having an irregular pattern shape.

In order to increase the conductivity of the conductive pattern that is formed by using the photolithography and photography process, a plating treatment may be additionally performed. The plating may use an electroless plating method, copper or nickel may be used as the plating material, and after the copper plating is performed, nickel plating may be performed thereon, but the scope of the present invention is not limited to these examples.

The present invention may also use a method using a mask. For example, after a mask having the conductive pattern shape is disposed to be close to the substrate, the conductive pattern material may be deposited and patterned on the substrate. At this time, the depositing method may use a heat deposition method by heat or electron beam, a PVD (physical vapor deposition) method such as sputter, and a CVD (chemical vapor deposition) method using an organometal material.

As the material of the conductive pattern, a metal having excellent thermal conductivity may be used. Further, the specific resistance value of the conductive pattern material may be a value in a range from 1 microOhm cm to 200 microOhm cm. As a specific example of the conductive pattern material, copper, silver, carbon nanotube (CNT), and the like may be used. The conductive pattern material may be used in a particle form. As the conductive pattern material, copper particles that are coated with silver may also be used.

When a paste comprising the conductive pattern material is used, the paste may further comprise an organic binder in addition to the above-described conductive pattern material so as to easily perform the printing process. The organic binder may have a volatile property in the sintering process. Examples of the organic binder comprise a polyacryl-based resin, a polyurethane-based resin, a polyester-based resin, a polyolefin-based resin, a polycarbonate-based resin, a cellulose resin, a polyimide-based resin, a polyethylene naphthalate-based resin, a denatured epoxy and the like, but are not limited thereto.

In order to improve the attachment ability of the paste to the substrate, the paste may further comprise a glass frit. The glass frit may be selected from commercial products, but it is possible to use an environmentally friendly glass frit that does not comprise a lead component. At this time, the average diameter of the glass frit used may be 2 micrometers or less and the maximum diameter thereof may be 50 micrometers or less.

If necessary, a solvent may be further added to the paste. Examples of the solvent comprise butyl carbitol acetate, carbitol acetate, cyclohexanon, cellosolve acetate, terpineol, and the like, but the scope of the present invention is not limited by these examples.

In the present invention, when a paste comprising a conductive pattern material, an organic binder, a glass frit and a solvent is used, it is preferred that as the weight ratio of each component, the conductive pattern material is present in an mount of 50 to 90% by weight, the organic binder is present in an amount of 1 to 20% by weight, the glass frit is present in an amount of 0.1 to 10% by weight, and the solvent is present in an amount of 1 to 20% by weight.

The line width of the above-described conductive pattern may be 100 micrometers or less, 30 micrometers or less, and 25 micrometers or less.

In the present invention, when the above-described paste is used, if the paste is sintered after the paste is printed as in the above-described pattern, a conductive pattern having conductivity is formed. At this time, the sintering temperature is not particularly limited, but may be 500 to 800° C., and 600 to 700° C. When the plastic substrate or film is used as the transparent substrate, the sintering process may be performed at a relatively low temperature, for example, 50 to 350° C.

The line width of the conductive pattern may be 100 micrometers or less, 30 micrometers or less, 25 micrometers or less, 10 micrometers or less, 7 micrometers or less, and 5 micrometers or less. The line width of the conductive pattern may be 0.1 micrometer or more, and 0.2 micrometer or more. The interval between lines of the conductive pattern may be 30 mm or less, 0.1 micrometer to 1 mm, 0.2 micrometer to 600 micrometers, and 250 micrometers or less.

The line height of the conductive pattern may be 100 micrometers or less, 10 micrometers or less, and 2 micrometers or less. In the present invention, the line width and line height of the conductive pattern may be made uniform by the above-described methods.

In the present invention, the uniformity of the conductive pattern may be in a range of ±3 micrometers in the case of the line width and in a range of ±1 micrometer in the case of the line height.

The display device according to the present invention comprises a conductive pattern, and it is necessary to control the configuration of the conductive pattern such that excessive heat generation and power consumption may be prevented in an electronic product. Specifically, for the conductive pattern to be comprised in the display device according to the present invention, the configuration thereof may be controlled such that the power consumption, voltage and amount of heat generated are within a range as described below.

When the conductive pattern of the display device according to the present invention is connected to a power source, power of 100 W or less may be consumed. When power exceeding 100 W is consumed, the 3D image distortion caused by an increase in temperature is alleviated, but the power-saving performance of the product caused by the increase in power consumption may be affected. In addition, the heating element of the display device according to the present invention may use a voltage of 20 V or less, and a voltage of 12 V or less. When the voltage exceeds 20 V, a voltage as low as possible may be used because there is a danger of electric shock caused by an electric leakage.

In the present invention, the temperature around the liquid crystal may be increased by imparting the heating function to the liquid crystal display, and through this, the 3D image distortion generated from a 3D display device may be minimized by implementing a high liquid crystal switching speed.

The surface temperature of the display device using the conductive pattern according to the present invention is characterized to be controlled at 40° C. or less. The 3D image distortion may be minimized by increasing the temperature to a temperature exceeding 40° C., but there is a problem in that the consumed power may exceed 100 W. When the heating element is connected to a power source, the amount of heat generated may be 400 W or less, and 200 W or less per $m^2$. The resistance of the conductive pattern may be 5 Ω/square or less, 1 Ω/square or less, and 0.5 Ω/square or less.

A control device for controlling the surface temperature of the display device may be provided in the display device according to the present invention. The control device may control the surface temperature of the display device to 40° C. or less as described above. The control device may also have a function of generating heat during a predetermined time by using a timer, and may also have a function of increasing the temperature to only an appropriate temperature and blocking the power source by attaching a temperature sensor to the surface of the display device. The control device may perform a function for minimizing the power consumption of the display device.

The invention claimed is:

1. A display device, comprising:
   a display panel, and
   a conductive pattern,
   wherein the conductive pattern comprises an irregular pattern,
   wherein the conductive pattern consists of copper, aluminum, silver, Mo, Ni, Cr, or Ti,
   wherein the irregular pattern comprises a pattern that is formed of closed figures in which distribution is continuous and a ratio of standard deviation with respect to an average value of areas of the closed figures (area distribution ratio) is 2% or more, or a pattern in which, when a straight line that intersects the conductive pattern is drawn, a ratio of standard deviation with respect to an average value of distances between adjacent intersection points of the straight line and the conductive pattern (distance distribution ratio) is 2% or more,
   wherein the display device comprises at least one of a heating element in which the conductive pattern is provided on at least one surface of a transparent substrate; a phase difference compensation film in which the conductive pattern is provided on at least one surface thereof; and a light guide plate in which the conductive pattern is provided on at least one surface thereof; and
   wherein the display device additionally comprises a backlight unit provided on a rear surface side of the display panel, and the conductive pattern is directly formed on a front surface or rear surface of the backlight unit.

2. The display device of claim 1, wherein the display panel further comprises a bus bar, and the conductive pattern comprises a conductive heating pattern which is electrically connected to the bus bar.

3. The display device of claim 1, wherein the display panel further comprises a bus bar, and the conductive pattern comprises a conductive heating pattern which is electrically connected to the bus bar and a conductive non-heating pattern which is not electrically connected to the bus bar.

4. The display device of claim 3, wherein the display device further comprises an edge-type backlight unit,
   the conductive non-heating pattern is formed such that a density is higher in a region closer to a light source of the edge-type backlight unit than a density in a region farther from the light source of the edge-type backlight unit, and
   the conductive heating pattern is formed such that the density is higher in a region farther from the light source of the edge-type backlight unit than the density in a region closer to the light source of the edge-type backlight unit.

5. The display device of claim 1, wherein the irregular pattern comprises at least one of a conductive pattern of a boundary form of figures forming a Voronoi diagram and a conductive pattern of a boundary form of figures formed of at least one triangle forming a Delaunay pattern.

6. The display device of claim 1, wherein the display device comprises an edge-type backlight unit.

7. The display device of claim 6, wherein the conductive pattern is configured to compensate for a deviation in temperature by the edge-type backlight unit.

8. The display device of claim 1, wherein the conductive pattern is disposed such that when the display device is driven, a standard deviation of a surface temperature of a display panel is 20% or less.

9. The display device of claim 1, wherein the conductive pattern is disposed such that a deviation in an opening ratio is 5% or less with respect to any circumcircle having a diameter of 20 cm.

10. The display device of claim 1, wherein the display device comprises two substrates and a liquid crystal cell comprising a liquid crystal material sealed between the substrates, and the conductive pattern is provided on at least one side of at least one substrate of the liquid crystal cell.

11. The display device of claim 1, wherein the heating element is provided on a front surface or a rear surface of the display panel.

12. The display device of claim 1, wherein power consumed by the conductive pattern is 100 W or less.

13. The display device of claim 1, wherein the conductive pattern uses a voltage of 20 V or less.

14. The display device of claim 1, wherein when the conductive pattern is connected to a power source, an amount of heat generated is 400 W or less per $m^2$.

15. A display device, comprising:
   a display panel, and
   a conductive pattern,
   wherein the conductive pattern comprises an irregular pattern,
   wherein the conductive pattern consists of copper, aluminum, silver, Mo, Ni, Cr or Ti,
   wherein the display device comprises a polarizing film and a polarizing film protective film provided on at least one surface of the polarizing film, and the conductive pattern is provided on at least one side or both sides of the polarizing film protective film,
   wherein the display panel further comprises a bus bar, and the conductive pattern comprises a conductive heating pattern which is electrically connected to the bus bar and a conductive non-heating pattern which is not electrically connected to the bus bar,
   wherein the display device further comprises an edge-type backlight unit,
   wherein the conductive non-heating pattern is formed such that a density is higher in a region closer to a light source of the edge-type backlight unit than a density in a region farther from the light source of the edge-type backlight unit, and
   wherein the conductive heating pattern is formed such that the density is higher in a region farther from the light source of the edge-type backlight unit than the density in a region closer to the light source of the edge-type backlight unit.

* * * * *